US009165783B2

(12) United States Patent
Nemani et al.

(10) Patent No.: US 9,165,783 B2
(45) Date of Patent: Oct. 20, 2015

(54) METHOD OF PATTERNING A LOW-K DIELECTRIC FILM

(71) Applicants: Srinivas D. Nemani, Sunnyvale, CA (US); Jeremiah T. Pender, San Jose, CA (US); Qingjun Zhou, San Jose, CA (US); Dmitry Lubomirsky, Cupertino, CA (US); Sergey G. Belostotskiy, Sunnyvale, CA (US)

(72) Inventors: Srinivas D. Nemani, Sunnyvale, CA (US); Jeremiah T. Pender, San Jose, CA (US); Qingjun Zhou, San Jose, CA (US); Dmitry Lubomirsky, Cupertino, CA (US); Sergey G. Belostotskiy, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/059,996

(22) Filed: Oct. 22, 2013

(65) Prior Publication Data

US 2014/0120726 A1 May 1, 2014

Related U.S. Application Data

(60) Provisional application No. 61/721,414, filed on Nov. 1, 2012.

(51) Int. Cl.

| | |
|---|---|
| ***H01L 21/302*** | (2006.01) |
| ***H01L 21/3105*** | (2006.01) |
| ***H01L 21/311*** | (2006.01) |
| *H01L 21/02* | (2006.01) |

(52) U.S. Cl.

CPC ...... *H01L 21/3105* (2013.01); *H01L 21/31116* (2013.01); *H01L 21/31138* (2013.01); *H01L 21/02126* (2013.01)

(58) Field of Classification Search

CPC ... H01L 21/31; H01L 21/302; H01L 21/3065; C23F 1/00

USPC .............................. 216/37, 67; 438/720, 725

See application file for complete search history.

(56) References Cited

U.S. PATENT DOCUMENTS

| | | | | |
|---|---|---|---|---|
| 5,872,065 | A * | 2/1999 | Sivaramakrishnan ........ | 438/784 |
| 7,001,833 | B2 * | 2/2006 | Bao et al. ...................... | 438/597 |
| 7,381,651 | B2 | 6/2008 | Sakthivel et al. | |
| 7,393,795 | B2 * | 7/2008 | Cheung et al. ................ | 438/725 |
| 8,143,174 | B2 * | 3/2012 | Xia et al. ...................... | 438/783 |
| 8,802,572 | B2 | 8/2014 | Nemani et al. | |

(Continued)

FOREIGN PATENT DOCUMENTS

KR 10-1170861 8/2012

OTHER PUBLICATIONS

International Search Report and Written Opinion for Application No. PCT/US2013/066953 dated Feb. 25, 2014, 11 pgs.

(Continued)

*Primary Examiner* — Duy Deo
*Assistant Examiner* — Maki Angadi
(74) *Attorney, Agent, or Firm* — Blakely Sokoloff Taylor Zafman LLP

(57) ABSTRACT

Methods of patterning low-k dielectric films are described. In an example, a method of patterning a low-k dielectric film involves forming and patterning a mask layer above a low-k dielectric layer, the low-k dielectric layer disposed above a substrate. The method also involves modifying exposed portions of the low-k dielectric layer with a nitrogen-free plasma process. The method also involves removing, with a remote plasma process, the modified portions of the low-k dielectric layer selective to the mask layer and unmodified portions of the low-k dielectric layer.

17 Claims, 10 Drawing Sheets

(56) References Cited

U.S. PATENT DOCUMENTS

2003/0075524 A1 4/2003 Kawaguchi et al.
2004/0084412 A1* 5/2004 Waldfried et al. .............. 216/67
2004/0144491 A1 7/2004 Ohuchi et al.
2007/0032087 A1 2/2007 Nishino et al.
2008/0224273 A1 9/2008 America et al.
2008/0311756 A1 12/2008 Chen et al.
2009/0229638 A1 9/2009 Yun et al.
2013/0023122 A1 1/2013 Nemani et al.
2013/0023123 A1 1/2013 Zhou et al.
2013/0023124 A1 1/2013 Nemani et al.
2013/0109187 A1 5/2013 Nemani et al.

OTHER PUBLICATIONS

Non-Final Office Action from U.S. Appl. No. 13/187,224 mailed Jun. 6, 2013, 11 pgs.

* cited by examiner

OXIDIZING ASH

102

~40% in SiCOH with k= 2.5

~10% in SiCOH with k= 2.5

REDUCING ASH

104

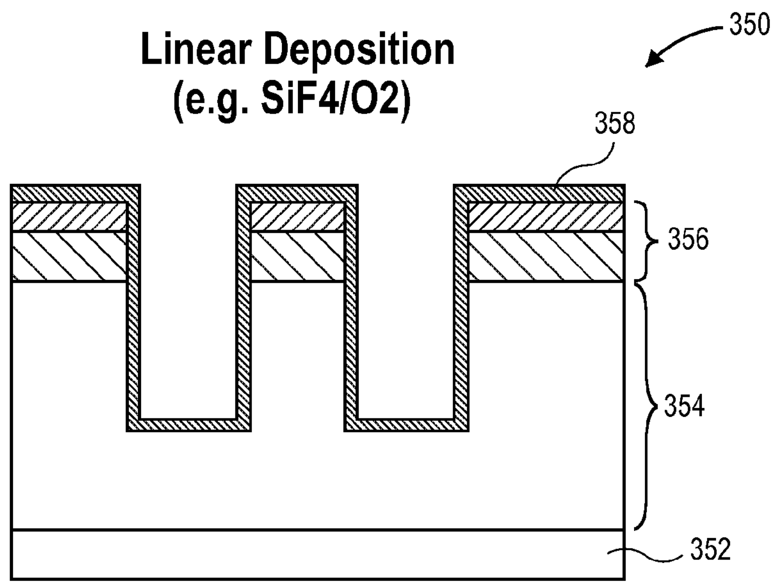
FIG. 3C1
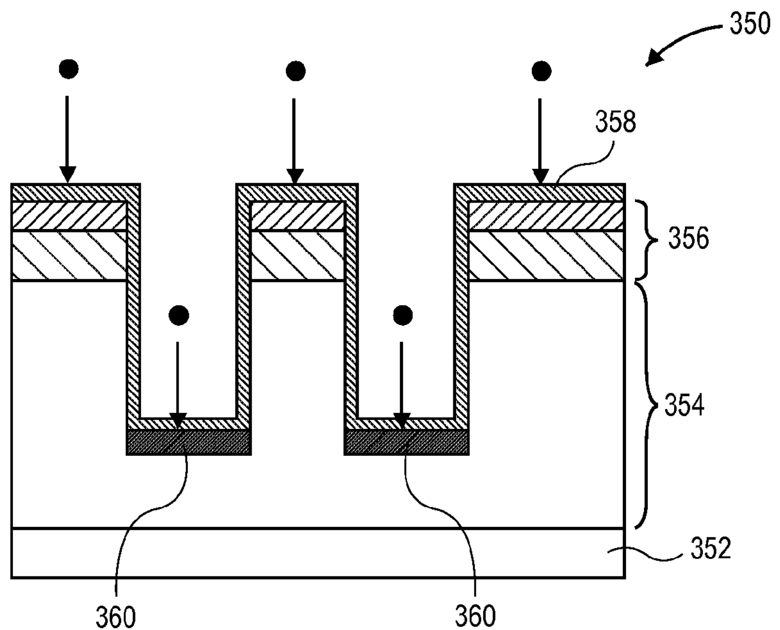
FIG. 3C2

METHOD OF PATTERNING A LOW-K DIELECTRIC FILM

CROSS-REFERENCE TO RELATED APPLICATIONS

This application claims the benefit of U.S. Provisional Application No. 61/721,414, filed on Nov. 1, 2012, the entire contents of which are hereby incorporated by reference herein.

BACKGROUND

1) Field

Embodiments of the present invention pertain to the field of semiconductor processing and, in particular, to methods of patterning low-k dielectric films.

2) Description of Related Art

In semiconductor manufacturing, a low-k dielectric is a material with a small dielectric constant relative to silicon dioxide. Low-k dielectric material implementation is one of several strategies used to allow continued scaling of microelectronic devices. In digital circuits, insulating dielectrics separate the conducting parts (e.g., wire interconnects and transistors) from one another. As components have scaled and transistors have moved closer together, the insulating dielectrics have thinned to the point where charge build-up and crosstalk adversely affect the performance of the device. Replacing the silicon dioxide with a low-k dielectric of the same thickness reduces parasitic capacitance, enabling faster switching speeds and lower heat dissipation.

However, significant improvements are needed in the evolution of low-k dielectric processing technology.

SUMMARY

Embodiments of the present invention include methods of patterning low-k dielectric films.

In an embodiment, a method of patterning a low-k dielectric film involves forming and patterning a mask layer above a low-k dielectric layer, the low-k dielectric layer disposed above a substrate. The method also involves modifying exposed portions of the low-k dielectric layer with a nitrogen-free plasma process. The method also involves removing, with a remote plasma process, the modified portions of the low-k dielectric layer selective to the mask layer and unmodified portions of the low-k dielectric layer.

In another embodiment, a method of patterning a low-k dielectric film involves forming and patterning a mask layer above a low-k dielectric layer, the low-k dielectric layer disposed above a substrate. The method also involves modifying exposed portions of the low-k dielectric layer with a plasma process, the modifying performed by using a first protection layer deposition process and second, subsequent low-k modification plasma process. The method also involves removing, with a remote plasma process, the modified portions of the low-k dielectric layer selective to the mask layer and unmodified portions of the low-k dielectric layer.

In another embodiment, an etch chamber includes a first processing stage for exposing a sample to a nitrogen-free plasma process. A second, different, processing stage is included for exposing the sample to a remote plasma process based on a combination of gases selected from the group consisting of $NF_3/O_2/N_2$, $CF_4/O_2/N_2$ and $NF_3/NH_3$.

BRIEF DESCRIPTION OF THE DRAWINGS

FIGS. 3C1 and 3C2 illustrate cross-sectional views representing a low-k modification as preformed in two operations, in accordance with an embodiment of the present invention.

DETAILED DESCRIPTION

Figure 1:
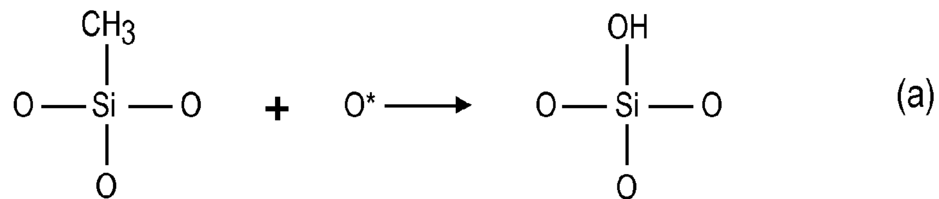
FIG. 1 illustrates mechanisms through which a low-k dielectric layer may be damages or impacted under conventional oxidizing plasma conditions used to remove polymer formed in a conventions fluorocarbon-based etching process.
Figure 1:
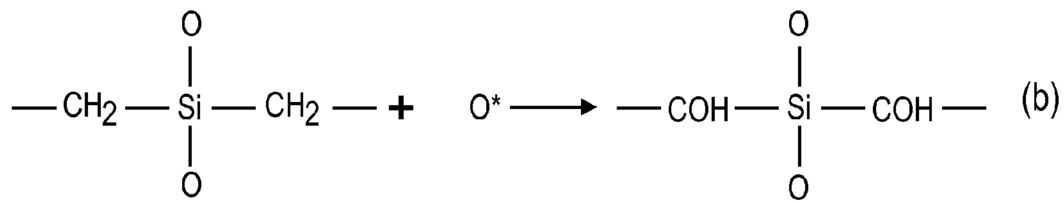
Figure 1:
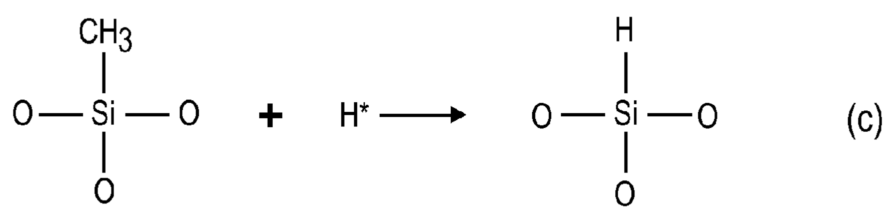

Methods of patterning low-k dielectric films are described. In the following description, numerous specific details are set forth, such as specific plasma treatments and effects for modifying portions of low-k dielectric films, in order to provide a thorough understanding of embodiments of the present invention. It will be apparent to one skilled in the art that embodiments of the present invention may be practiced without these specific details. In other instances, well-known aspects, such as photolithography patterning and development techniques for mask formation, are not described in detail in order to not unnecessarily obscure embodiments of the present invention. Furthermore, it is to be understood that the various embodiments shown in the Figures are illustrative representations and are not necessarily drawn to scale.

New approaches and processing sequences for etching low k films damage-free to the low k are described. Traditional dielectric etching is can result in sidewall damage caused by plasma processing and during post etch polymer residue removal. By contrast, one or more embodiments described herein do not employ traditional $C_xF_y$ gas chemistry. Furthermore, post etch residue may be removed in-situ, thus eliminating the need for any post etch clean. Such two-operation processing may be carried out in a 2-stage plasma reactor (or, alternatively, may be performed in two independent chambers as well). In an exemplary embodiment, a first stage plasma is a dry etch plasma based on $SiF_4$ (or $SiCl_4$, $SiH_4$, TMS, or other chloro or fluoro silanes precursors), Argon (or He, Xe, Ne inert gas), and Nitrogen (or, as an alternative, oxygen). The first stage is used to etch low k films with growth observed on the sidewall (believed to be SiN or SiNOCH type film). The film growing on the sidewall during etch is used to protect the low k film from further damage. A second stage plasma is employed as a remote plasma that to selectively remove the etch residue from the sidewall. One approach is to use $NF_3/NH_3$ to form $NH_4F$ which reacts with the residue to form a salt that sublimes at >100 C. Another approach is to use $O_2/N_2/NF_3$ or $O_2/N_2/CF_4$ chemistry to remove the layer highly selective to oxide and low k. The two stages of the etch process may be repeated multiple times for improved profile control.

Porous low-k dielectric materials, e.g. porous SiCOH, are typically sensitive to plasma etching. Issues typically arise surrounding damage caused to an Si—$CH_3$ network in an ultra-low-k (ULK) film during an etch process. Such damage may impact the mechanical integrity of a ULK film. Furthermore, there may be an "F memory effect" resulting from polymer formed during a fluorocarbon-based ($C_xF_y$-based) etch process. The sensitivity may also arise from a high porosity which allows etching chemistry to diffuse deep into low-k dielectric film.

One of the key issues with patterning low k dielectric films has been the control on the level of damage caused during the etch process. The plasma parameters and chemistry used typically modify the carbon content of the low-k film causing changes in electrical behavior (k value and leakage). One of the root causes for the damage to the carbon has been during the strip of the $C_xF_y$ polymer that deposits on the low-k surface during the etch process. However, typical dielectric etch processes benefit from $C_xF_y$-based chemistry as it can provide sidewall protection during plasma etch and increase anisotropic etch capability.

In accordance with one or more embodiments described herein, fundamental aspects of etching are addressed by using alternative gases for etching. For example, in one embodiment, a combination of Si-based precursors (e.g., $SiF_4$, $SiCl_4$, other fluorosilanes, chlorosilanes, iodosilanes), a nitriding gas (e.g., $N_2$, $NH_3$, etc.) and/or an inert dilution gas (e.g., Ar, He, Xe, Ne) is used. An anisotropic etch is made possible by formation of a Si-based (N-rich) deposition on the sidewall of a trench being etched. This deposition also protects the low-k film from plasma attack.

In other embodiments, oxygen is used along with or instead of $N_2$ to form an Si—O based deposition on the sidewall. The following stage or operation in the etch sequence involves use of a remote plasma or low energy plasma to generate species that can selectively remove such a film from low k. One example is the use of $NF_3$/$NH_3$ based remote plasma to form $NH_4F$ that reacts with the sidewall deposition to form a silicate species. The silicate species sublimes at elevated temperatures. In one such embodiment, the above described process is highly selective to low-k material in that low-k material is not etched in the process. In another embodiment, use of an $O_2$/$N_2$/$NF_3$ or NO/$NF_3$ based remote plasma process is employed to etch away Si—N type sidewall deposition. The process is tuned to be highly selective to low-k films. These two aspects of the etch process may be repeated multiple times for profile control.

One or more embodiments of the present invention are targeted at the fluorocarbon-free etching of low-k dielectric films, such as ULK films. In an embodiment, one or more methods herein are used to provide a patterning approach with reduced damage or detrimental impact to the low k dielectric film, e.g., in an etch patterning process. In one such embodiment, approaches described herein may be particularly useful for C-doped oxide films. Conventional fluorocarbon chemistry-based ULK etching processes inevitably deposit CF polymer on the ULK surfaces. The polymer is subsequently removed with an oxidizing post etch treatment (PET) plasma. However, the PET plasma may oxidize carbon-containing ULK dielectrics. Oxidized carbon-containing ULK dielectrics may be amenable to undesirable moisture absorption, resulting in the dielectric constant (k value) of the ULK dielectrics to increase. In accordance with an embodiment of the present invention, fluorocarbon-free etching of ultra-low k dielectric is described below.

FIG. 1 illustrates mechanisms through which a low-k dielectric layer may be damages or impacted under conventional oxidizing plasma conditions used to remove polymer formed in a conventions fluorocarbon-based etching process. Referring to mechanism (a) of FIG. 1, when undergoing an oxidizing ash, an $SiO_3$-methyl fragment, which makes up approximately 40% of a SiCOH low-k film with a dielectric constant of about 2.5, can undesirably lose its methyl group to a hydroxide group. Referring to mechanism (b) of FIG. 1, when undergoing an oxidizing ash, an $SiO_2$—$(CH_2)_2$ fragment, which makes up approximately 10% of a SiCOH low-k film with a dielectric constant of about 2.5, can undesirably be converted to an $SiO_2$—$(COH)_2$ fragment. Referring to mechanism (c) of FIG. 1, when undergoing a reducing ash, an $SiO_3$-methyl fragment, which makes up approximately 40% of a SiCOH low-k film with a dielectric constant of about 2.5, can undesirably lose its methyl group to a hydride ligand (H).

In an embodiment, a fluorocarbon-free etch is used to pattern a low-k dielectric film. Thus, CF polymer doe not form, which would otherwise require removal by an ashing process. In one embodiment, etch processes described herein include two basic functions performed in the same operation: (1) modification of an exposed portion of a low-k film through treatment with a first plasma etch to convert a portion of the film to a silicon oxide (or low-carbon containing oxide), and (2) removal of the treated layer with a second, remote, plasma etch. Thus, in an embodiment, a ULK film is not exposed to any halogen radicals or O radicals that may otherwise cause damage to a Si—$CH_3$ network.

Figure 2:
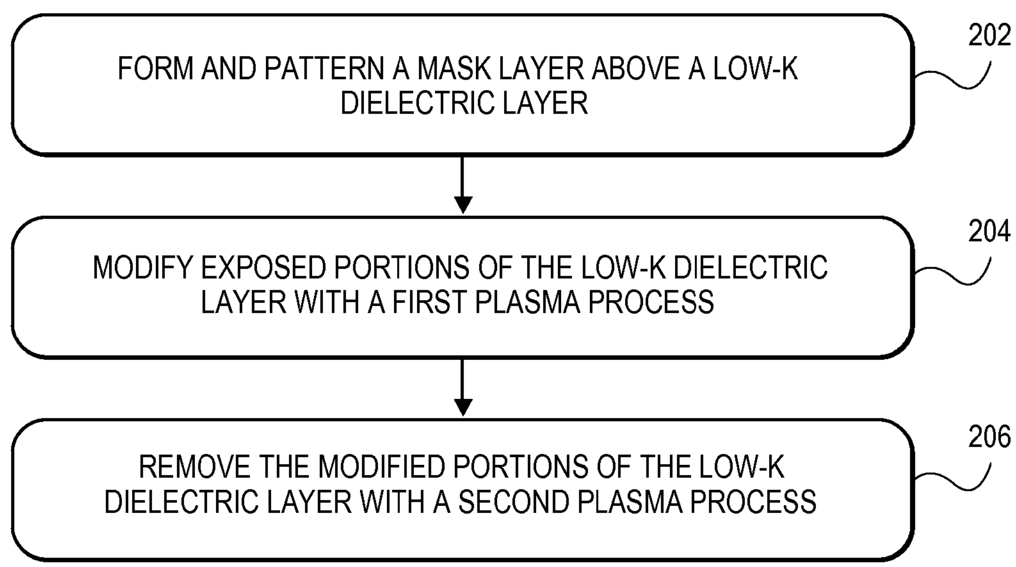
FIG. 2 is a Flowchart representing operations in a method of patterning a low-k dielectric film, in accordance with an embodiment of the present invention.

In an aspect of the present invention, a low-k dielectric film is patterned by modification of a portion of the low-k dielectric film and subsequent removal of the modified portion selective to the unmodified portions of the film. For example, FIG. 2 is a Flowchart 200 representing operations in a method of patterning a low-k dielectric film, in accordance with an embodiment of the present invention. FIGS. 3A-3F illustrate cross-sectional views representing operations in a method of patterning a low-k dielectric film, in accordance with an embodiment of the present invention.

Figure 3A:
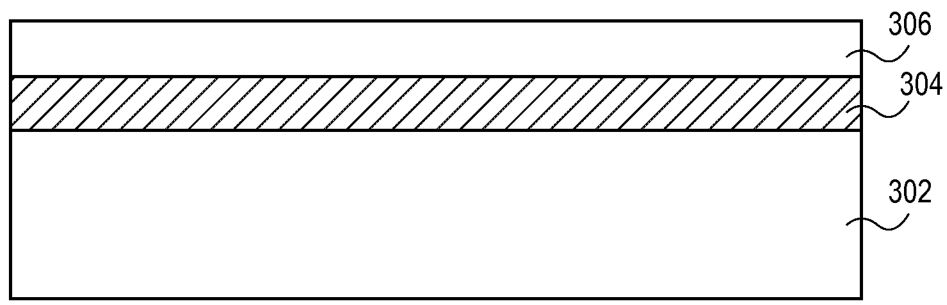
FIGS. 3A-3F illustrate cross-sectional views representing various operations in a method of patterning a low-k dielectric film, corresponding to the Flowchart of FIG. 2, in accordance with an embodiment of the present invention.
Figure 3B:
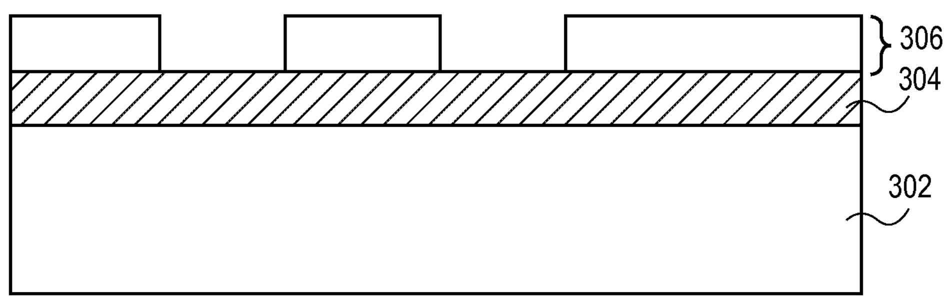

Referring to operation 202 of Flowchart 200 and corresponding FIGS. 3A and 3B, a method of patterning a low-k dielectric film includes forming (FIG. 3A) and patterning (FIG. 3B) a mask layer 306 above a low-k dielectric layer 304, the low-k dielectric layer 304 disposed above a substrate 302. In an embodiment, the mask layer 306 is a photoresist layer formed directly on the low-k dielectric layer 304. In another embodiment, a photoresist layer is first formed above a hardmask layer (306 in this embodiment) disposed above the low-k dielectric layer 304.

In an embodiment, e.g., in the case that mask layer 306 is a hardmask layer that is patterned, forming and patterning the mask layer 306 above the low-k dielectric layer 304 includes forming and patterning a non-oxide mask layer. The non-oxide mask layer may provide selectivity against an oxide etch, as described in greater detail below. In a specific such embodiment, the mask layer 306 is a metal-containing layer such as, but not limited to a layer of titanium nitride or a layer of tantalum nitride. In another specific such embodiment, the mask layer 306 is a layer of non-oxide dielectric material such as, but not limited to, a layer of silicon nitride.

In another embodiment, e.g., in the case that mask layer 306 is a photoresist layer that is patterned, forming and patterning the mask layer 306 above the low-k dielectric layer 304 includes forming and patterning a photoresist layer. The photoresist layer may be composed of a material suitable for use in a lithographic process. That is, in an embodiment, the photoresist layer is exposed to a light source and subsequently developed. In one embodiment, the portions of the photoresist layer to be exposed to the light source will be removed upon developing the photoresist layer, e.g., the photoresist layer is composed of a positive photoresist material. In a specific embodiment, the photoresist layer is composed of a positive photoresist material such as, but not limited to, a 248 nanometer node resist, a 193 nanometer node resist, a 157 nanometer node resist, an extreme ultra-violet (EUV) resist, or a phenolic resin matrix with a diazonaphthoquinone sensitizer. In another embodiment, the portions of the photoresist layer to be exposed to the light source will be retained upon developing the photoresist layer, e.g., the photoresist layer is composed of a negative photoresist material. In a specific embodiment, the photoresist layer is composed of a negative photoresist material such as, but not limited to, poly-cis-isoprene and poly-vinyl-cinnamate.

In an embodiment, the low-k dielectric layer 304 has a permittivity less than that of silicon dioxide, e.g., less than approximately 3.9. In one embodiment, the low-k dielectric layer 304 is a material such as, but not limited to, a fluorine-doped silicon dioxide, a carbon-doped silicon dioxide, a porous silicon dioxide, a porous carbon-doped silicon dioxide, a porous SiLK, a spin-on silicone based polymeric dielectric, or a spin-on organic polymeric dielectric. In accordance with an embodiment of the present invention, the low-k dielectric layer 304 is a porous SiCOH layer having a dielectric constant of less than 2.7.

Substrate 302 may be composed of a material suitable to withstand a fabrication process and upon which semiconductor processing layers may suitably reside. In accordance with an embodiment of the present invention, substrate 302 is composed of a group IV-based material such as, but not limited to, crystalline silicon, germanium or silicon/germanium. In a specific embodiment, providing substrate 302 includes providing a monocrystalline silicon substrate. In a particular embodiment, the monocrystalline silicon substrate is doped with impurity atoms. In another embodiment, substrate 302 is composed of a III-V material. In an embodiment, a plurality of semiconductor devices resides on substrate 302, below low-k dielectric layer 304.

Figure 3C:
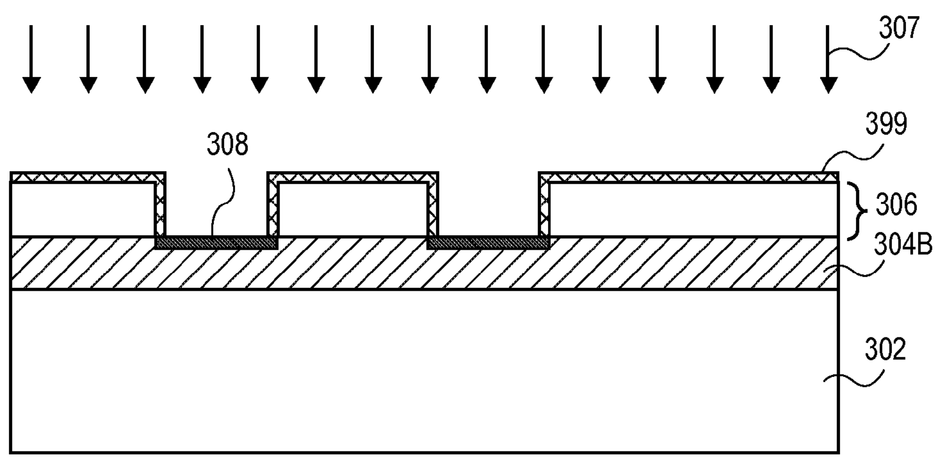

Referring to operation 204 of Flowchart 200 and corresponding FIG. 3C, patterning the low-k dielectric film also includes modifying exposed portions of the low-k dielectric layer 304 with a plasma process 307. The exposed portions of the low-k dielectric layer 304 are those portions exposed by the patterned mask 306. Plasma 307 is used to modify the exposed portions to provide modified portions 308 and unmodified portion 304B of the low-k dielectric layer 304. In addition to modifying the low-k material, a protective material layer 399 may also be deposited in the same process, as depicted in FIG. 3C. Such a protective material layer 399 is described in greater detail below in association with FIGS. 4A and 4B. Thus, in an embodiment, deposition of a protective layer and modification of a low-k film are performed in the same process, or at least essentially at the same time.

In an embodiment, the first plasma process involves an $SiF_4/N_2/Ar$-based plasma. In one such embodiment, the low-k sidewall is protected with an SiON or SiONH layer, where the oxygen is scavenged or introduced intentionally. In a specific embodiment, the Ar from the plasma is used to bombard only the bottom portion of the trench, selectively and anistropically modifying the low-k material (as shown more clearly in FIGS. 4A and 4B). In an embodiment, in place of or in addition to $SiF_4$, species such as, but not limited to $SiCl_4$, $Si(CH_3)_3H$, $SiH_4$, $Cl_2SiH_2$, $Si_2Cl_6$, $Si_2F_6$ (e.g., essentially species including a Si—Cl bond or Si—F bond) may be used. In a specific embodiment, Ar has a pressure approximately in the range of 5-50 mTorr. In an embodiment, $N_2$ is used with a power approximately in the range of 10-1000 W. In an embodiment, a bias RF frequency approximately in the range of 2 MHz-60 MHZ is used. In an embodiment, a combination of two or more frequencies is used for biasing, e.g., 2 MHz/60 MHz, 13 MHz/60 MHz, or 27 MHz/60 MHz combinations. In an embodiment, the electrostatic chuck (ESC) temperature is approximately 10 degrees Celsius but may be performed up to approximately 110 degrees Celsius. In an embodiment, the above conditions are all used in conjunction together.

In another embodiment, the first plasma process, or first stage process, is performed in a nitrogen-free environment. For example, in one embodiment, oxygen ($O_2$) is used to provide protection for forming or formed low-k trench sidewalls during etching or further etching of the low-k film. The oxygen may be introduced in a relatively small amount, e.g., less than approximately 10 sccm. For example, in a specific embodiment, the first stage process is a single operation process (as depicted in FIG. 3C) involving use of a plasma based on a total flow composition of approximately 1200 sccm argon (Ar), approximately 200 sccm $SiF_4$, and approximately 5 sccm of oxygen. In a particular such embodiment, the single process is performed at a temperature approximately in the range of 10-110 degrees Celsius. In another particular embodiment, the pressure of the plasma is approximately in the range of 10-70 mTorr and, preferably, approximately 40 mTorr. In another particular embodiment, the single operation, first stage plasma is biased with a bottom-powered bias of approximately 13 MHz at approximately 300 Watts and a simultaneous showerhead bias of approximately 60 MHz at approximately 150 Watts. It is to be understood that in a two-stage chamber, the showerhead is between the two stages. In a very specific embodiment, the first stage process is a single process (as depicted in FIG. 3C) involving use of a plasma based on a total flow composition of approximately 1200 sccm argon (Ar), approximately 200 sccm $SiF_4$, and approximately 5 sccm of oxygen, at a temperature approximately in the range of 10-110 degrees Celsius, a pressure approximately in the range of 10-70 mTorr and, preferably, approximately 40 mTorr, and a bias including a bottom-powered bias of approximately 13 MHz at approximately 300 Watts and a simultaneous showerhead bias of approximately 60 MHz at approximately 150 Watts.

In yet another embodiment, first plasma process, or first stage process, is performed as a two-operation process. For example, the first stage plasma process includes a first operation that provides a protective deposition. In one such embodiment, a protection layer is formed by flowing trimethyl silane ($Si(CH_3)_3H$) and oxygen ($O_2$) to form the protection layer. In a specific such embodiment, ($Si(CH_3)_3H$) is flowed at less than approximately 20 sccm, while oxygen is flowed at approximately 10-50 sccm. In a particular such embodiment, the protection layer is formed at a pressure approximately in eth range of 5-20 mTorr and, preferably, at approximately 10 mTorr. In a specific embodiment, the deposition time for the protection layer has a duration of approximately 5 seconds, but may be as long as approximately 40 seconds. The first stage plasma process next includes a second operation for treatment or modification of the low-k material. For example, in an embodiment, the second operation is performed by using argon (Ar), nitrogen ($N_2$), or both, for modifying the low-k film for a duration approximately in the range of 5 seconds-4 minutes. The two-operation first stage plasma process may be used instead of the above described single operation first stage process depending on the profile desired, i.e., selection between the two approaches provides a level of tunability of overall etch profile ultimately formed during the low-k film patterning. In the single operation approach, protection layer deposition and low-k film treatment are performed at the same time (as depicted in FIG. 3C), while in a two-operation approach, protection layer deposition and low-k film treatment are performed in two different operations, as described below in association with FIGS. 3C1 and 3C2.

FIGS. 3C1 and 3C2 illustrate cross-sectional views representing a low-k modification as preformed in two operations, such as the two-operation first stage plasma embodiments described immediately above, in accordance with an embodiment of the present invention. Referring to FIG. 3C1, a material stack 350 including a substrate 352, low-k material 354 and mask stack 356 has a liner layer 358 deposited thereon, e.g., by SiF4/O2 deposition. Referring then to FIG. 3C2, ultra-low-k treatment, e.g., using He, N2, or Ar ions, is used to modify (forming regions 360), through the liner 358 portions of the low-k material 354.

Figure 3D:
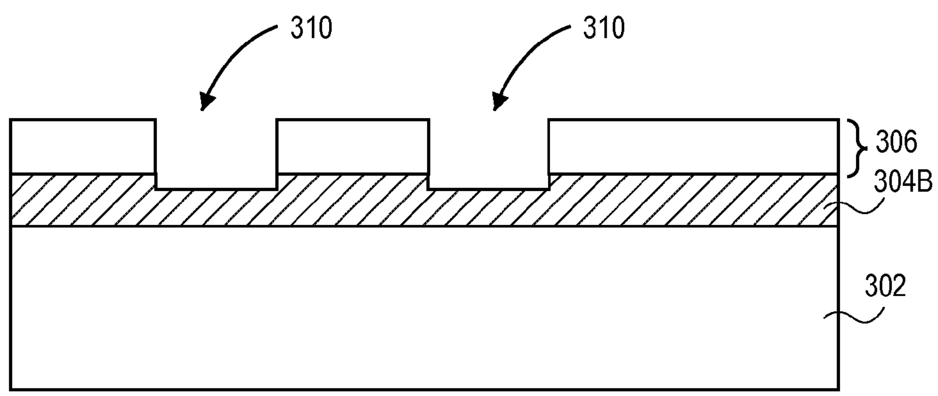

Referring to operation 206 of Flowchart 200 and now to corresponding FIG. 3D, patterning the low-k dielectric film also includes removing the modified portions 308 of the low-k dielectric layer 304B. In an embodiment, the removal is selective to the mask layer 306 and to the unmodified portions 304B of the low-k dielectric layer 304. Since carbon may be removed during the modification of the low-k dielectric layer 304, the modified portions 308 may be more oxide-like in nature. Accordingly, in an embodiment, an oxide removal process is used to remove the modified portions 308, examples of which are provided below.

In an embodiment, the second, remote, plasma is used to essentially clean the surfaces by removing the modified low-k material and the protective layer 399. In one such embodiment, an $NF_3/O_2/N_2$ or a $CF_4/O_2/N_2$ or an $NF_3/NH_3$ plasma is used remotely as the second plasma. Thus, in one embodiment, a first plasma (a plasma that is not remote) is used to form a protecting layer and modify a low-k film at the same time. Then, a second plasma (a remote plasma) is used to remove the protective layer and the modified low-k material layer. An example of a chamber suitable for such a process is described below in association with FIG. 5B.

In an embodiment, the second stage involves at least removal by a combination of etching and sublimation. In one such embodiment, the sublimation is performed at a temperature greater than approximately 100 degrees Celsius. In an embodiment, a one-operation approach is used for the second stage: in an example, a plasma based on a combination of $NF_3/NH_3$ at a temperature of approximately 70 degrees Celsius and a pressure approximately in the range of 1-10 Torr is used for etch and sublimation performed together. In another embodiment, a two-operation approach is used for the second stage: in an example, a plasma based on a combination of $NF_3/NH_3$ is first employed at a temperature of approximately 10-50 degrees Celsius and a pressure approximately in the range of 500 mTorr-3 Torr for etching. Subsequently, the plasma is next employed at a temperature of approximately 110 degrees Celsius and a pressure approximately in the range of 500 mTorr-3 Torr for sublimation.

Thus, in accordance with an embodiment of the present invention, etching of a low-k dielectric film is achieved by partial film conversion of the low-k dielectric layer. In one embodiment, the etching may be referred to as atomic layer etching or molecular level etching (MLE) since only one or a few layers of exposed portions of the low-k dielectric film are converted and subsequently removed per process cycle. As exemplified above, in one embodiment, the etching process includes first selectively modifying the composition of a horizontal ULK surface with a first plasma and then removing the modified portions with a second, remote, plasma. In one embodiment, approaches described herein represent true film conversion by methyl knock-off from a low-k dielectric film.

By contrast, conventional chemical etching typically involves deposition of polymer on ULK surfaces, which are removed with an oxidizing PET operation. An aqueous-based clean is used to remove damaged ULK, which may result in line bending and moisture absorption into the ULK. Instead, in an embodiment herein, essentially damage free etching of a ULK material is achieved by completely avoiding CF etching chemistry. An inert plasma is used to remove carbon from a ULK surface. A downstream plasma is then used to remove modified portions of the ULK. The downstream plasma etching may be extremely selective to the ULK due to its nature of pure chemical etching.

The above method described in association with operation 204 of Flowchart 200 may be repeated as required to achieve a suitable extent of patterning of the low-k dielectric layer 304. For example, referring again to FIG. 3D, trenches 310 are formed in the low-k dielectric layer 304, leaving partially patterned, and unmodified, low-k dielectric layer 304B. The depth of trenches 310 may not be deep enough for suitable patterning of the low-k dielectric layer 304, especially since the modification and removal process described above may only remove one or several molecular layers at a time.

Accordingly, in an embodiment, the low-k dielectric layer 304 is subjected to multiple modification and removal processes of exposed portions thereof until a depth of trenches 310 suitable for subsequent processing requirements is achieved. In one such embodiment, the modifications and removal is repeated until partial trenches are formed in, but not entirely through, the low-k dielectric layer 304. In another such embodiment, the modifications and removal is repeated until complete trenches are formed entirely through the low-k dielectric layer 304.

Figure 3E:
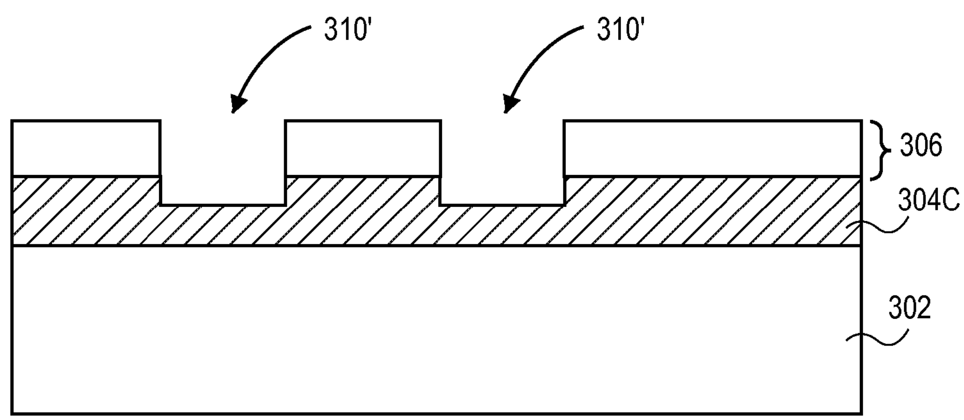
Figure 3F:
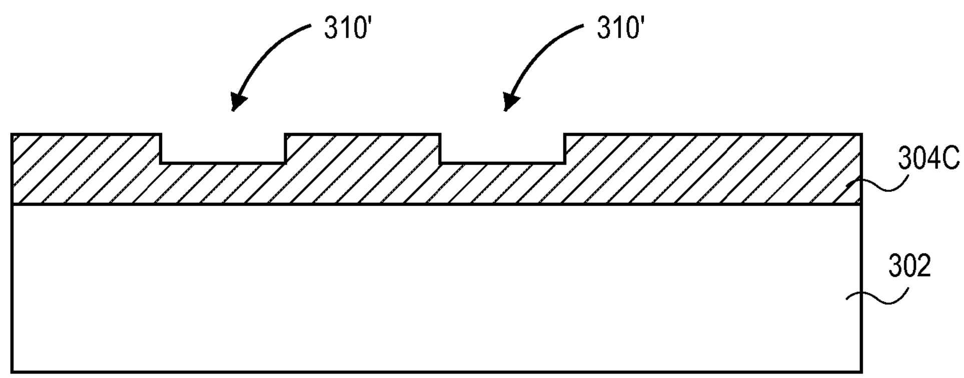

As an example of a cyclic process, FIGS. 3E and 3F illustrate an embodiment in which, in conjunction with FIGS. 3A-3D, a total of two cycles are performed to pattern a low-k dielectric layer. It is to be understood that many more than two modification and removal cycles may need to be performed to suitably pattern a low-k dielectric film.

Referring to FIG. 3E, exposed portions of the low-k dielectric layer 304B, e.g., exposed surfaces of trenches 310, are modified and etched with a second modification plasma process involving first and second remote plasma processes in a same operation. The exposed portions of the low-k dielectric layer 304B are those portions exposed by the patterned mask 306 as well as exposed sidewalls of the low-k dielectric layer 304B. The second iteration of the modification and etch cycle of FIG. 3E formed deeper trenches 310' and hence a patterned low-k film 304C.

Referring to FIG. 3F, once a desired depth for trenches 310' is achieved, which may involve numerous cycles of the above described modification and removal process, the mask 306 may be removed. However, in an embodiment, care must be taken upon removal of mask 306 such that the removal is selective against the patterned low-k dielectric layer 304C and does not detrimentally impact (e.g., by raising the dielectric constant) the patterned low-k dielectric layer 304C.

In an embodiment, the mask layer 306 is composed of a photoresist material and is removed in an ashing process. However, in one embodiment, the ashing plasma is applied in a manner to limit ashing damage to the patterned low-k dielectric layer 304C. In a specific such embodiment, although there may be similarities in the composition of a photoresist-based mask layer 306 and the patterned low-k dielectric layer 304C, the differences are exploited for a selective removal of the mask layer 306. For example, an organic mask may include a hydrocarbon polymer (including the elements C, H, O), where an etch thereof may depend more on neutrals species rather than on ions. Meanwhile, the patterned low-k dielectric layer 304C may include an O—Si—O network with Si—$CH_3$ groups, where an etch thereof may require some ion energy and neutrals to induce damage. Approaches for selective removal of the mask layer 306 may, in an embodiment, include increasing ashing selectivity to the patterned low-k dielectric layer 304C by high ion/neutral ratio which may remove the organic mask on horizontal surfaces while preserving the patterned low-k dielectric layer 304C on vertical surfaces.

In accordance with another embodiment of the present invention, a cyclic passivation and ashing approach is used to reduce ashing damage typically associated with removal of a photoresist layer from an exposed or partially exposed low-k dielectric layer. In one such embodiment, a process scheme includes alternating operations of passivation and ashing. During each of the passivation operations, a silicon-containing passivation agent is used to selectively react with an ultra low-k (ULK) material to form a thin layer of silicon-containing film on exposed portions of the ULK material. During each of the ashing operations, the thin layer of silicon-containing film acts to protect against an ashing plasma, e.g., which may be used to etch a photoresist layer. The protecting reduces damage that the ashing plasma would otherwise cause to the ULK material. The protecting nature of the passivating layer may be considered to be in situ, in the sense that the film may form Si—O linkages upon exposure to the ashing plasma. The Si—O linkages may provide selectivity against the ashing plasma.

The passivation layer may be removed or at least somewhat compromised during the ashing by chemical reaction or physical sputtering. Accordingly, in one embodiment, cyclic passivation/ashing operations are used. Such cyclic passivation/ashing operations may be repeated until all organic mask material (e.g., an overlying photoresist layer) is removed. Any remaining portions of the passivation layer may be removed, e.g., in one embodiment, by a diluted hydrofluoric acid (HF) clean.

In a specific embodiment, in order to form a passivation layer for protecting the patterned low-k dielectric layer 304C during removal of the mask layer 306, a silicon source layer is first formed on the surfaces of the trenches 310' of the patterned low-k dielectric layer 304C. In an embodiment, the silicon source layer is formed from molecular species that react with a hydrolyzed portion of the patterned low-k dielectric layer 304C. In one embodiment, the silicon source layer forms a covalent bond between the silicon source layer and the exposed portions of the patterned low-k dielectric layer 304C. In one embodiment, the silicon source layer is formed from a species such as, but not limited to, silicon tetrachloride ($SiCl_4$), dimethylsilane ($(CH_3)_2SiH_2$), trimethylsilane ($(CH_3)_3SiH$), N-(trimethylsilyl)dimethylamine ($(CH_3)_3SiN(CH_2)_2$), or 1,1,1,3,3,3-hexamethyldisilazane (HMDS). In one embodiment, the substrate 302 is situated on a hot plate during the forming of the silicon source layer.

Next, the silicon source layer is exposed to an oxygen source to form an Si—O-containing layer on the surfaces of the trenches 310' of the patterned low-k dielectric layer 304C and to remove at least a portion of the photoresist-based mask layer 306. In an embodiment, the Si—O-containing layer protects the patterned low-k dielectric layer 304C during removal of some or all of the mask layer 306. It is to be understood that, in the absence of the Si—O-containing layer, the patterned low-k dielectric layer 304C may otherwise be damaged by the process used to remove the portion of the mask layer 306. In an embodiment, exposing the silicon source layer to an oxygen source includes treating with a plasma. In one embodiment, the plasma is based on an oxygen radical source. The oxygen radical source is a molecule with a dissociation product composed of an oxygen radical. In a specific such embodiment, the oxygen radical source is a source such as, but not limited to, oxygen ($O_2$), ozone ($O_3$), carbon dioxide ($CO_2$), or water ($H_2O$). In an embodiment, subsequent to the removal of the mask layer 306 the Si—O-containing layer is removed. In one such embodiment, the Si—O-containing layer is removed by a dry etch process. In another embodiment, a wet etch solution including hydrofluoric acid (HF) is used to remove the Si—O-containing layer. However, it is to be understood that no such additional treatment may be needed. For example, in one embodiment, the Si—O-containing layer is removed during the ashing by chemical reaction or physical sputtering.

As described above, a protection layer may be formed during a low-k modification process. As an example, FIGS. 4A and 4B illustrate cross-sectional views representing various operations in a method of patterning a low-k dielectric film, and corresponding chamber configurations, in accordance with an embodiment of the present invention.

Figure 4A:
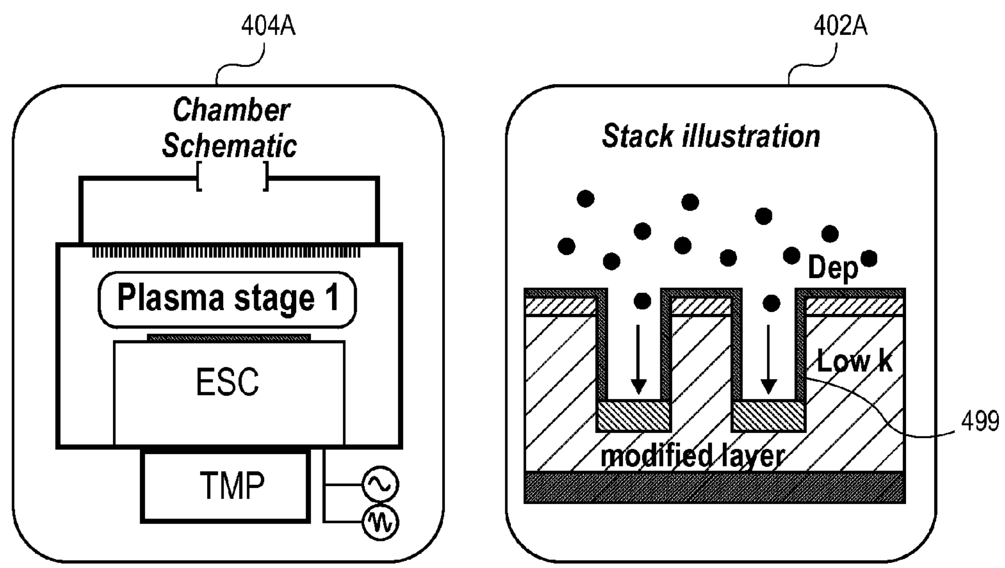
FIGS. 4A and 4B illustrate cross-sectional views representing various operations in a method of patterning a low-k dielectric film, and corresponding chamber configurations, in accordance with an embodiment of the present invention.

Referring to FIG. 4A, a material stack 402A such as the stack shown in FIG. 3C includes trenches formed (or being formed) in a low-k dielectric layer. A protective layer 499 is formed in a first plasma process while exposed portions of the low-k dielectric layer are modified in the same plasma process. In an embodiment, the first plasma process is performed while the stack 402A is positioned at a first plasma stage location 404A, as is described in greater detail in association with FIG. 5B. Thus, in an embodiment, plasma deposition for sidewall protection (and to seal pores to prevent damage) with anisotropic film modification is performed in a same process.

Figure 4B:
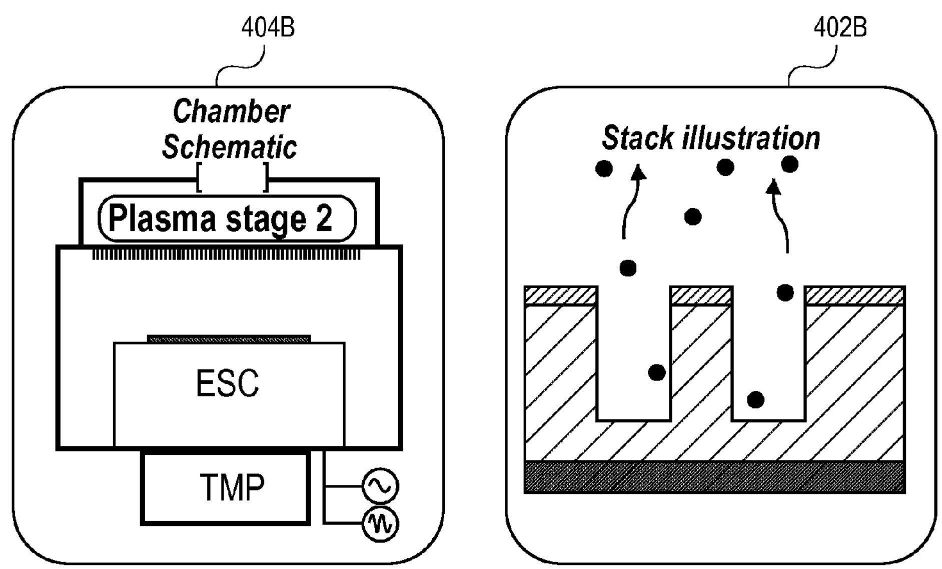

Referring to FIG. 4B, a material stack 402B such as the stack shown in FIG. 3D includes cleaned trenches in the low-k dielectric layer. The protective layer 499 and the modified low-k material from FIG. 4A are removed in a second plasma process. In an embodiment, the second plasma process is a remote plasma process. In one such embodiment, the second plasma process is performed while the stack 402B is positioned at a second plasma stage location 404B, as is described in greater detail in association with FIG. 5B. In a specific embodiment, a Siconi plasma process is used to remove the deposited and modified layers.

Overall, in an embodiment, a non-carbon based approach is used to selectively remove portions of a low-k film with no k-value shift. In one embodiment, a sequential process is used where, first, a Si-based precursor is used for etching with sidewall protection and, second, a highly selective radical based removal is employed. Advantages may include, but are not limited to, use of a carbon-free process (no ash or post-etch treatment necessarily needed), potentially no wet clean needed, low ion energies used leading to minimal metal hardmask erosion, and self limiting treatment and removal operation leading to good depth and uniformity control.

In an embodiment, one or more of the above processes is performed in a plasma etch chamber. For example, in one embodiment, one or more of the above processes is performed in an Applied Centura® Enabler dielectric etch system, available from Applied Materials of Sunnyvale, Calif., USA. In another embodiment, one or more of the above processes is performed in an Applied Materials™ AdvantEdge G3 etcher, also available from Applied Materials of Sunnyvale, Calif., USA.

Patterning of a low-k dielectric layer may be conducted in processing equipment suitable to provide an etch plasma in proximity to a sample for etching. For example, FIG. 5A illustrates a system in which a method of low-k dielectric film patterning is performed, in accordance with an embodiment of the present invention.

Figure 5A:
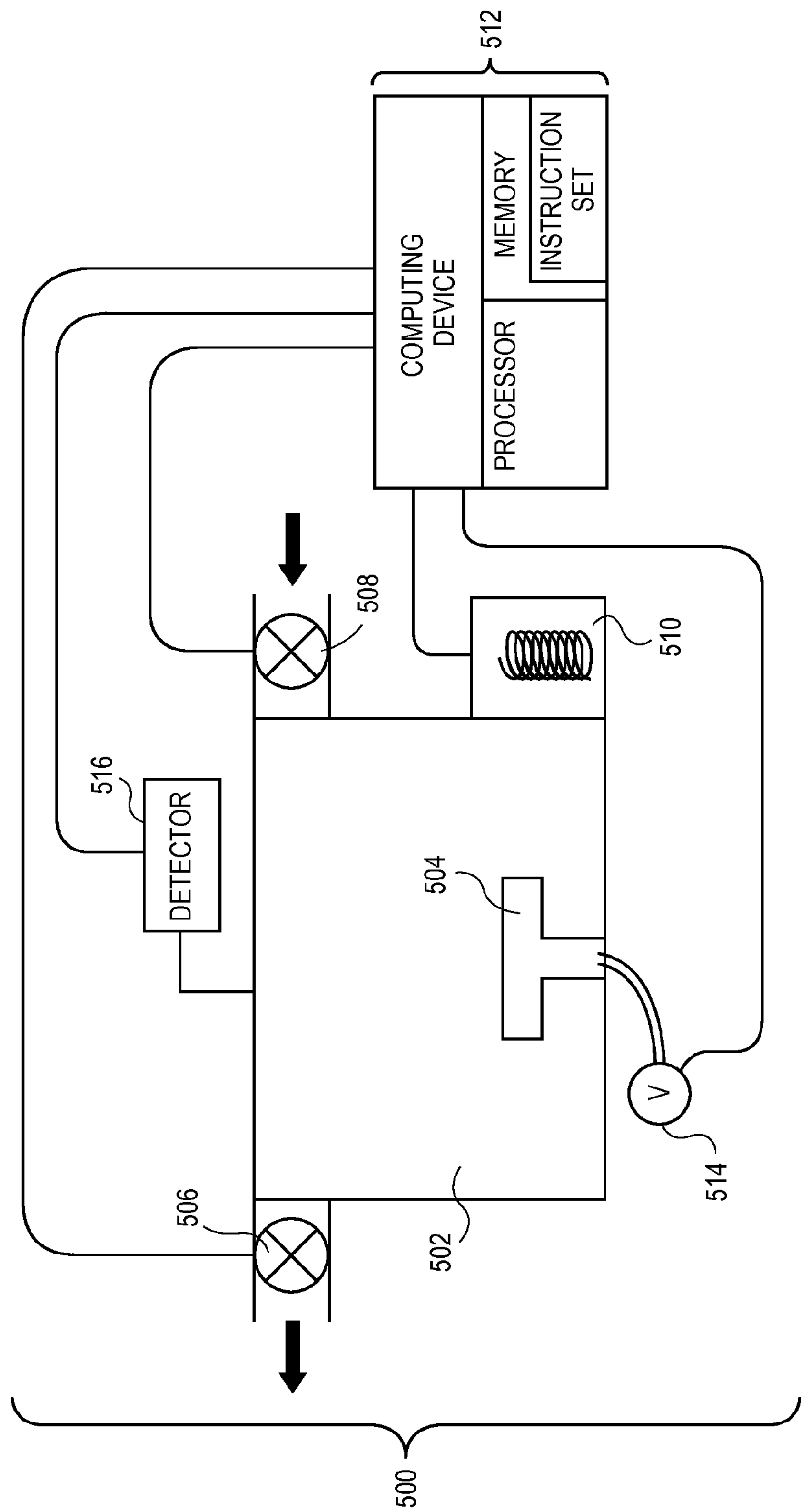
FIG. 5A illustrates a system in which a method of low-k dielectric film patterning is performed, in accordance with an embodiment of the present invention.

Referring to FIG. 5A, a system 500 for conducting a plasma etch process includes a chamber 502 equipped with a sample holder 504. An evacuation device 506, a gas inlet device 508 and a plasma ignition device 510 are coupled with chamber 502. A computing device 512 is coupled with plasma ignition device 510. System 500 may additionally include a voltage source 514 coupled with sample holder 504 and a detector 516 coupled with chamber 502. Computing device 512 may also be coupled with evacuation device 506, gas inlet device 508, voltage source 514 and detector 516, as depicted in FIG. 5A.

Chamber 502 and sample holder 504 may include a reaction chamber and sample positioning device suitable to contain an ionized gas, i.e. a plasma, and bring a sample in proximity to the ionized gas or charged species ejected there from. Evacuation device 506 may be a device suitable to evacuate and de-pressurize chamber 502. Gas inlet device 508 may be a device suitable to inject a reaction gas into chamber 502. Plasma ignition device 510 may be a device suitable for igniting a plasma derived from the reaction gas injected into chamber 502 by gas inlet device 508. Detection device 516 may be a device suitable to detect an end-point of a processing operation. In one embodiment, system 500 includes a chamber 502, a sample holder 504, an evacuation device 506, a gas inlet device 508, a plasma ignition device 510 and a detector 516 similar to, or the same as, those included in an Applied Centura® Enabler dielectric etch system or an Applied Materials™ AdvantEdge G3 system.

Figure 5B:
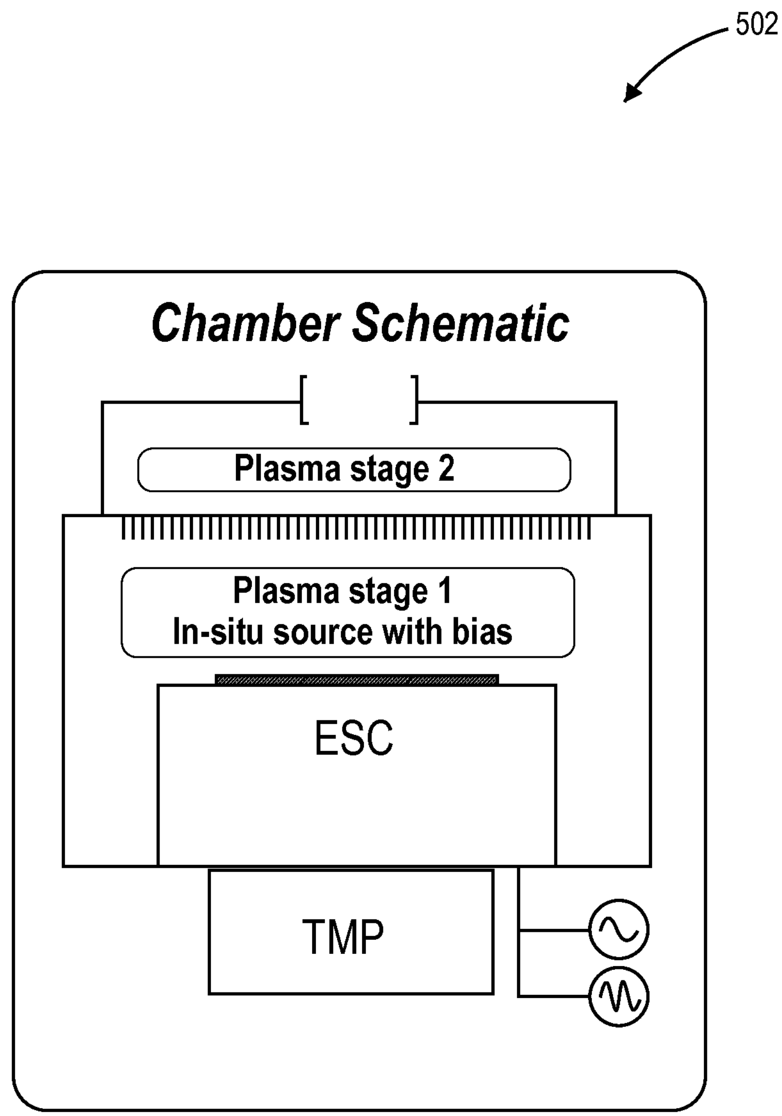
FIG. 5B illustrates a schematic of a possible configuration for chamber 502 of FIG. 5A, in accordance with an embodiment of the present invention.

FIG. 5B illustrates a schematic of a possible configuration for chamber 502 of FIG. 5A, in accordance with an embodiment of the present invention. Referring to FIG. 5B, and in association with the description of FIGS. 3C and 3D, a chamber 502 has a first stage (plasma stage 1, which may include an in-situ source with bias) for performing a first, non-remote, plasma process. For example, a plasma process involving formation of a protective layer along with modification of a low-k film may be performed at stage 1. The chamber 502 also has a second stage (plasma stage 2) for performing a remote plasma process. For example, a plasma process involving cleaning of a deposited protection layer along with modified low-k material may be performed at stage 2. Such a configuration for chamber 502 may enable fine tuning radicals/ion ratio. Benefits of such a tunable source may include control of etch anisotropy polymer-free treatments. Layer-by-layer removal defined by depth of modified layer may also be performed. Additionally, tunable selectivity based on fine control of metastable species (e.g., NH, F, O, H, Cl, etc) may be achieved.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
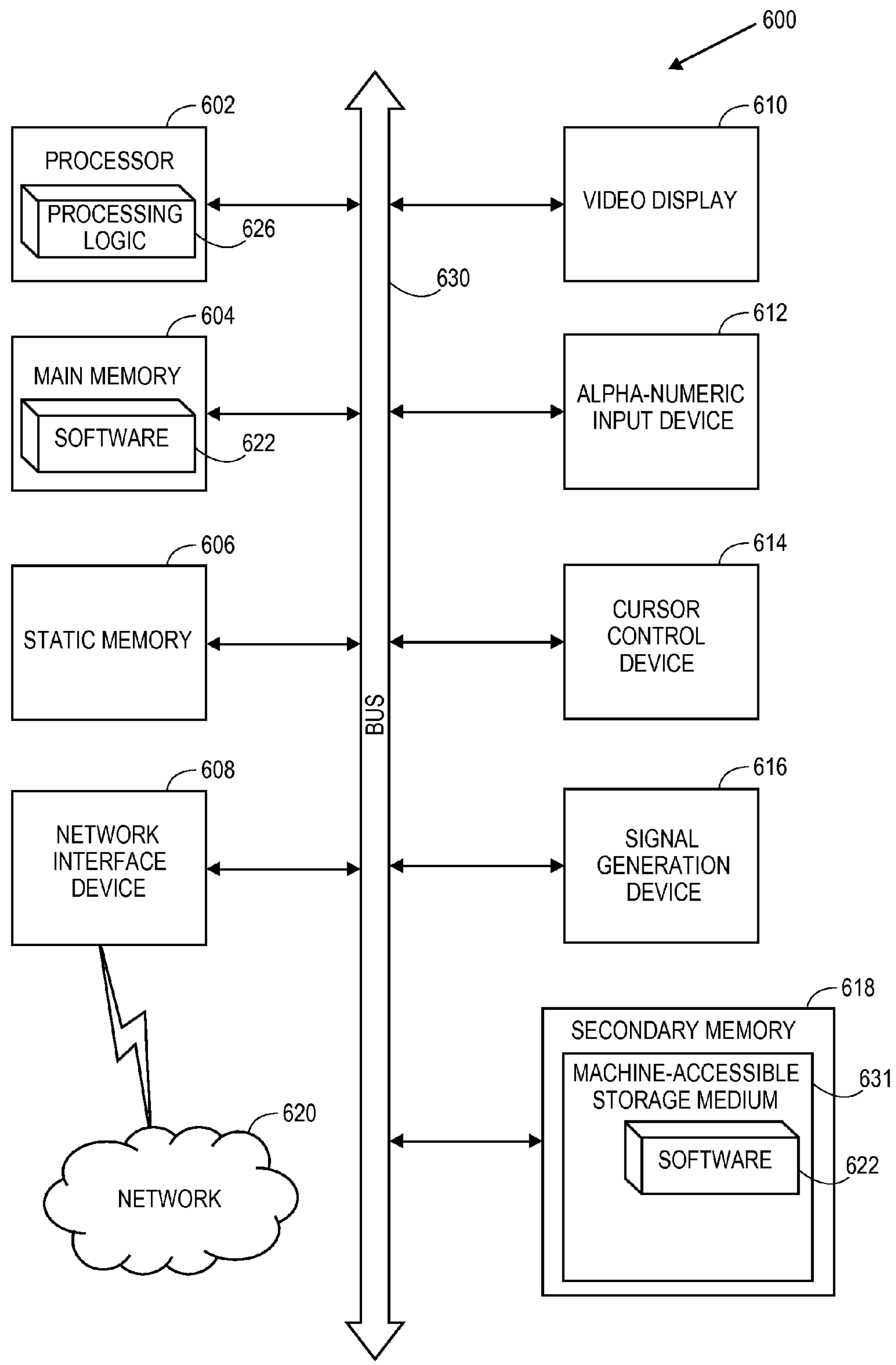
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of patterning a low-k dielectric layer. The method includes forming and patterning a mask layer above a low-k dielectric layer, the low-k dielectric layer disposed above a substrate. Exposed portions of the low-k dielectric layer are modified with a plasma process. In a same operation, with a remote plasma process, the modified portions of the low-k dielectric layer are removed selective to the mask layer and unmodified portions of the low-k dielectric layer.

Thus, methods of patterning low-k dielectric films have been disclosed.

What is claimed is:

1. A method of patterning a low-k dielectric film, the method comprising:

forming and patterning a mask layer above a low-k dielectric layer, the low-k dielectric layer disposed above a substrate;

modifying exposed portions of the low-k dielectric layer with a nitrogen-free plasma process;

removing, with a remote plasma process, the modified portions of the low-k dielectric layer selective to the mask layer and unmodified portions of the low-k dielectric layer; and repeating the modifying and the removing one or more times to form one or more trenches in the low-k dielectric layer without forming a fluorocarbon polymer on the low-k dielectric layer.

2. The method of claim 1, wherein modifying exposed portions of the low-k dielectric layer with the nitrogen-free plasma process comprises using a plasma based on a combination of Ar, $SiF_4$ and $O_2$.

3. The method of claim 1, wherein removing the modified portions of the low-k dielectric layer with the remote plasma process comprises using a plasma based on a combination of gases selected from the group consisting of $NF_3/O_2/N_2$, $CF_4/O_2/N_2$ and $NF_3/NH_3$.

4. The method of claim 1, wherein modifying exposed portions of the low-k dielectric layer with the nitrogen-free plasma process further comprises depositing a protection layer and modifying the low-k layer in a same operation.

5. The method of claim 4, wherein modifying exposed portions of the low-k dielectric layer and depositing the protection layer with the nitrogen-free plasma process comprises using a plasma based on a combination of Ar, $SiF_4$ and $O_2$.

6. The method of claim 4, wherein removing the modified portions of the low-k dielectric layer with the remote plasma process further comprises removing the protection layer with the remote plasma process.

7. The method of claim 6, wherein removing the modified portions of the low-k dielectric layer and the protection layer with the remote plasma process comprises using a plasma based on a combination of gases selected from the group consisting of $NF_3/O_2/N_2$, $CF_4/O_2/N_2$ and $NF_3/NH_3$.

8. The method of claim 1, wherein the modifying the exposed portions of the low-k dielectric layer with the nitrogen-free plasma process comprises processing at a first stage of a plasma etch chamber, and wherein removing the modified portions of the low-k dielectric layer with the remote plasma process comprises processing at a second, different, stage of the plasma etch chamber.

9. The method of claim 8, wherein a showerhead of the etch chamber is positioned between the first and second stages, the second stage above the showerhead.

10. A method of patterning a low-k dielectric film, the method comprising:

forming and patterning a mask layer above a low-k dielectric layer, the low-k dielectric layer disposed above a substrate;

modifying exposed portions of the low-k dielectric layer with a plasma process, the modifying performed by using a first protection layer deposition process and second, subsequent low-k modification plasma process;

removing, with a remote plasma process, the modified portions of the low-k dielectric layer selective to the mask layer and unmodified portions of the low-k dielectric layer; and repeating the modifying and the removing one or more times to form one or more trenches in the low-k dielectric layer without forming a fluorocarbon polymer on the low-k dielectric layer.

11. The method of claim 10, wherein using the first protection layer deposition process comprises flowing a combination of trimethyl silane and $O_2$.

12. The method of claim 10, wherein using the low-k modification plasma process comprises using Ar, $N_2$, or both Ar and $N_2$.

13. The method of claim 10, wherein removing the modified portions of the low-k dielectric layer with the remote plasma process comprises using a plasma based on a combination of gases selected from the group consisting of $NF_3/O_2/N_2$, $CF_4/O_2/N_2$ and $NF_3/NH_3$.

14. The method of claim 10, wherein using the first protection layer deposition process comprises forming a protection layer, and wherein removing the modified portions of the low-k dielectric layer with the remote plasma process further comprises removing the protection layer with the remote plasma process.

15. The method of claim 14, wherein removing the modified portions of the low-k dielectric layer and the protection layer with the remote plasma process comprises using a plasma based on a combination of gases selected from the group consisting of $NF_3/O_2/N_2$, $CF_4/O_2/N_2$ and $NF_3/NH_3$.

16. The method of claim 10, wherein the modifying the exposed portions of the low-k dielectric layer comprises processing at a first stage of a plasma etch chamber, and wherein removing the modified portions of the low-k dielectric layer with the remote plasma process comprises processing at a second, different, stage of the plasma etch chamber.

17. The method of claim 16, wherein a showerhead of the etch chamber is positioned between the first and second stages, the second stage above the showerhead.

* * * * *